(12) United States Patent
Nardini et al.

(10) Patent No.: US 6,640,149 B1
(45) Date of Patent: Oct. 28, 2003

(54) SYSTEM AND METHOD OF DEVELOPING A CAN BOTTOM PROFILE AND A CAN WITH A DOMED BOTTOM STRUCTURE

(75) Inventors: Dubravko Nardini, Oxford (GB); Yi Gao, Oxon (GB); Stuart MacEwen, Inverary (CA)

(73) Assignee: Alcan International Limited, Montreal (CA)

(*) Notice: Subject to any disclaimer, the term of this patent is extended or adjusted under 35 U.S.C. 154(b) by 0 days.

(21) Appl. No.: 09/532,167

(22) Filed: Mar. 21, 2000

(51) Int. Cl.[7] .............................................. G06F 17/50
(52) U.S. Cl. ........................... 700/117; 700/97; 703/1; 703/6; 220/606
(58) Field of Search .................. 700/97, 103, 104–106, 700/117, 145, 173, 182, 194; 703/1, 6, 9, 7; 220/606, 609, 624

(56) References Cited

U.S. PATENT DOCUMENTS

| | | | |
|---|---|---|---|
| 4,147,271 A | | 4/1979 | Yamaguchi ................ 220/606 |
| 4,431,112 A | | 2/1984 | Yamaguchi ................ 220/606 |
| 4,834,256 A | | 5/1989 | McMillin ................... 220/606 |
| 5,105,973 A | * | 4/1992 | Jentzsch et al. ........... 220/606 |
| 5,297,054 A | * | 3/1994 | Kienzle et al. ............. 700/182 |
| 5,351,852 A | | 10/1994 | Trageser et al. ............ 220/606 |
| 5,452,238 A | * | 9/1995 | Kramer et al. ................. 703/1 |
| 5,594,651 A | * | 1/1997 | St. Ville ...................... 700/98 |
| 5,956,500 A | * | 9/1999 | Shimmell ....................... 703/7 |
| 5,984,511 A | * | 11/1999 | Vasey-Glandon et al. ....... 703/6 |
| 6,044,210 A | * | 3/2000 | Nagtegaal ..................... 716/9 |
| 6,083,268 A | * | 7/2000 | Kelsey et al. .................. 703/7 |
| 6,131,761 A | * | 10/2000 | Cheng et al. ............... 220/623 |
| 6,132,108 A | * | 10/2000 | Kashiwamura et al. ........ 703/2 |
| 6,434,492 B1 | * | 8/2002 | Pollack et al. ............... 702/41 |

* cited by examiner

Primary Examiner—Leo Picard
Assistant Examiner—Paul Rodriguez
(74) Attorney, Agent, or Firm—Cooper & Dunham LLP

(57) ABSTRACT

A method of developing a can (e.g. beverage) bottom profile is presented. More specifically, finite element analysis on a parametric representation of a beverage can is used for developing an improved beverage can design. By specifying performance parameters that the beverage can must meet and providing specific geometric limitations on the design an improved beverage can design is obtained. The resulting improved beverage can design is independent of the gauge of the material used in construction thereof. The improved beverage can provides a concave dome on the bottom of the can connected to a bottom stand which in turn is connected to a cylindrical side wall of the can via a slanted connecting wall.

23 Claims, 4 Drawing Sheets

SYSTEM AND METHOD OF DEVELOPING A CAN BOTTOM PROFILE AND A CAN WITH A DOMED BOTTOM STRUCTURE

FIELD OF THE INVENTION

The present invention is related to a system and method of developing a can bottom profile on the basis of predetermined performance conditions and to a can with a domed bottom structure designed using said method. More specifically, the present invention relates to a method of developing a can bottom profile using finite element analysis techniques.

BACKGROUND OF THE INVENTION

The profile of the bottom of a beverage can is generally defined by a series of intersecting arcs and lines. Dimensional parameters can be derived based on the size of the intersecting arcs and lines and their positions relative to one another. The dimensional parameters include such things as the radii of arcs, the degree of slant of lines and the height and length of certain intersection points relative to a fixed reference. The number of dimensional parameters used to define a profile made of such arcs and lines is typically between 10 to 20. A known generic can profile showing common parameters is shown in FIG. 2A.

Traditionally, the effectiveness of a can bottom profile was determined by trial and error. This requires the manufacturing of a prototype of a can to be used in physical testing of the performance properties of the can. The performance properties evaluated are often those of dome reversal pressure and response to axial loading. Dome reversal pressure is the amount of internal pressure required for the dome at the bottom of the can to be reversed in direction from concave to convex and depends largely on the geometrical features inside the bottom rim or stand.

Axial loading is the amount of force the can is able to withstand in the longitudinal direction and depends largely on the geometrical features outside the bottom rim or stand. If the performance properties of the current prototype do not meet the required standards then adjustments must be made to the design based on educated guessing. A new prototype for the revised design is then made and tested. This procedure is repeated until a sufficient design is made that meets the imposed standards.

The traditional trial and error method is not only a cumbersome and slow process but it is also expensive. Each time a new can bottom design is made a physical model has to be manufactured, creating a multitude of failed prototypes as the iterative procedure continued. Manufacturing prototypes takes time as with each small variation the dies used to create the prototype have to be changed or manufactured again to account for the change in design.

Recently, finite element analysis techniques have been used to examine the performance properties of structural designs. However, for a profile consisting of 13 parameters 1.5 million computer analyses would be required to examine variants of only three possible parameters. To exhaustively examine even half of the 13 parameters is not easily accomplished, even with the powerful computing power currently available.

SUMMARY OF THE INVENTION

As such, it is an object of the present invention to provide a method of developing an improved can bottom profile using a minimum number of calculations.

Another object of the present invention is to provide a system for developing an improved can bottom profile using a minimum number of calculations.

Another object of the present invention is to provide a can with a domed bottom structure to achieve resistance to failure under internal pressure and to axial load failure.

In accordance with one aspect of the present invention there is provided a method executed by a computer system as part of a computer-implemented program for developing a can design profile from a can design model represented in parametric form using a set of performance conditions and a set of design constraints, said method comprising the steps of: (a) selecting optimization conditions including parameters from the parametric form of the can design model and values for these parameters; (b) performing finite element analysis on the parametric form of the can design model; and (c) modifying the values of the selected parameters based on the results of step (b).

In accordance with another aspect of the present invention there is provided a method executed by a computer system as part of a computer-implemented program for developing a can design profile from a can design model represented in parametric form using a set of performance conditions and a set of design constraints, said method comprising the steps of: (a) selecting a plurality of optimization condition sets including parameters from the parametric form of the can design model and values for these parameters; (b) performing finite element analysis on the parametric form of the can design model using each of the optimization sets; and (c) modifying the values of the selected parameters in each optimization set based on the results of step (b).

In accordance with an additional aspect of the present invention there is provided a method of fabricating a can design profile for an article of manufacture from a can design model represented in parametric form using a set of performance indicators and a set of design constraints, said method comprising the steps of: (a) selecting optimization conditions including parameters from the parametric form of the can design model and values for these parameters; (b) performing finite element analysis on the parametric form of the can design model; (c) modifying the values of the selected parameters based on the results of step (b) and (d) converting the can design model in parametric form into the can design profile.

In accordance with a further aspect of the present invention there is provided a computer system for developing a can design profile from a can design model represented in parametric form using a set of performance conditions and a set of design constraints, said system comprising: (a) selection means for selecting optimization conditions including parameters from the parametric form of the can design model and values for these parameters; (b) finite element analysis means for performing finite element analysis on the parametric form of the can design model; (c) processing means for modifying the values of the selected parameters based on the results of step (b); and (d) conversion means for converting the can design model in parametric form into the can design profile.

In accordance with a further aspect of the present invention there is provided a metal can designed by using the aforementioned can design profile methods, said metal can comprising: a cylindrical side wall; a bottom stand having a curved base on which the can rests and connected to one end to the curved base an outside outwardly inclined bottom wall and connected to the other end of the curved base is an inside inwardly inclined bottom wall; an outside connecting wall being substantially flat and having a curved connector on each end thereof for connecting the outside connecting wall to the cylindrical side wall on one end and on the other end connecting the outside connecting wall to the outside outwardly inclined bottom wall; a concave dome-shaped bottom wall; and an inside connecting wall being substantially flat and having a curved connector on each end thereof for connecting the inside connecting wall to the concave dome-shaped bottom wall and on the other end connecting the outside connecting wall to the inside inwardly inclined bottom wall.

BRIEF DESCRIPTION OF THE DRAWINGS

Exemplary embodiments of the invention will now be described in conjunction with the attached drawings, in which.

DESCRIPTION OF THE INVENTION

Finite element analysis is an effective way of determining performance of a design under given loads without the need to build a physical model. Using this analysis technique, a computer model can be built and validated to determine the performance of a specific design under certain conditions. The design can then be modified to obtain more desirable results. Unfortunately, as the design description of an object becomes more complex, the number of parameters needed to describe the design increases and the computing power needed to exhaustively explore all the possible combinations of parameters becomes prohibitively high.

Representation of the design using a finite number of parameters is employed in order to be able to explore the design space of finite dimensions. It is not possible to explore all the possible combinations of values of these parameters, therefore a selective optimization method has to be used. Optimization is an iterative procedure in which each iteration consists of two distinct steps—one is the modification of the design through parameter value changes, and the other is the finite element analysis to provide performance results. In the process, the designs that meet or exceed the predetermined performance conditions and that do not violate any of the set design constraints (allowable geometry) are taken into further iterations, until the procedure converges to an optimal design. Alternatively, the iterative process may continue on any design until the performance of that design meets the predetermined performance conditions and conforms to the design constraints.

Figure 1A:
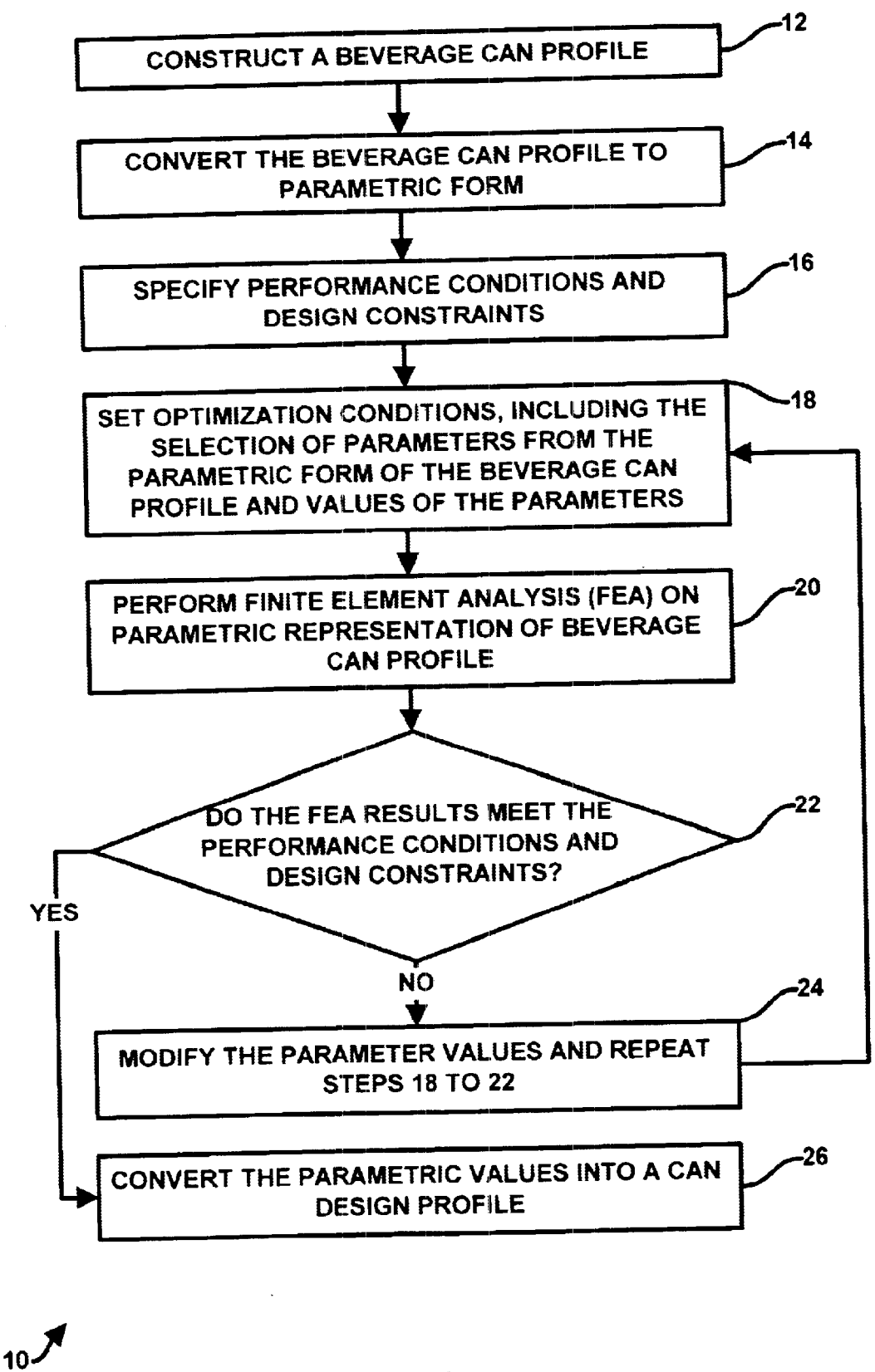
FIG. 1A is a flow chart representing a method of developing a can bottom profile using finite element analysis techniques according to an embodiment of the present invention.

FIG. 1A shows a method 10 of developing a can (e.g. beverage) profile according to an embodiment of the present invention. In step 12 an initial can profile design is constructed. The initial can profile design can be made using a CAD program, such as IDEAS-S™. This initial design is the basis of the design optimization process and is based on an industry known generic profile such as a profile 100 shown in FIG. 2A.

The design constructed in step 12 is converted into parametric form in step 14. Performance conditions and design constraints are defined in step 16 that are used to direct the optimization process. The performance conditions and design constraints include performance specifications such as minimum withstandable loads, etc. and geometric limitations due to standardization, stacking ability, etc. In step 18, optimization conditions are established including which parameters are to be considered in the process and an initial value is assigned to each parameter. Optimization can be performed by a software program such as, for example, ANSYS™ FE. In step 20 finite element analysis is performed on the beverage can profile and the results are compared with the performance conditions and design constraints in step 22. The finite element analysis can be performed by a software program such as, for example, ABAQUS™ FE. In step 24 the optimization process is performed by modifying the values of the parameters and reiterating steps 18 to 22 on modified design profiles. This optimization process may be performed only on those profiles that meet the design criteria and constraints. This reiteration process continues until positive change in the performance is no longer obtained after changing the design profile. Alternatively, the iterative process may be used for all models until their performance meets the performance conditions and the designs conform to the constraints. After the parametric values have been optimized they are converted into a can design profile in step 26.

Performance conditions are used as a benchmark against which different designs can be compared and are usually representative of the various conditions in which a can is placed during filling and shipping. In general, the desirable performance is maximum resistance to the largest forces that act on the can. Specifically, the largest forces acting on a can are internal pressure (dome reversal pressure) and axial load (bottom squat load). The design constraints are generally shape constraints that are placed on the can. The design constraints include things such as stacking of the can must be possible. Also, minimal displacement of the bottom under typical pressure loads is important.

Figure 1B:
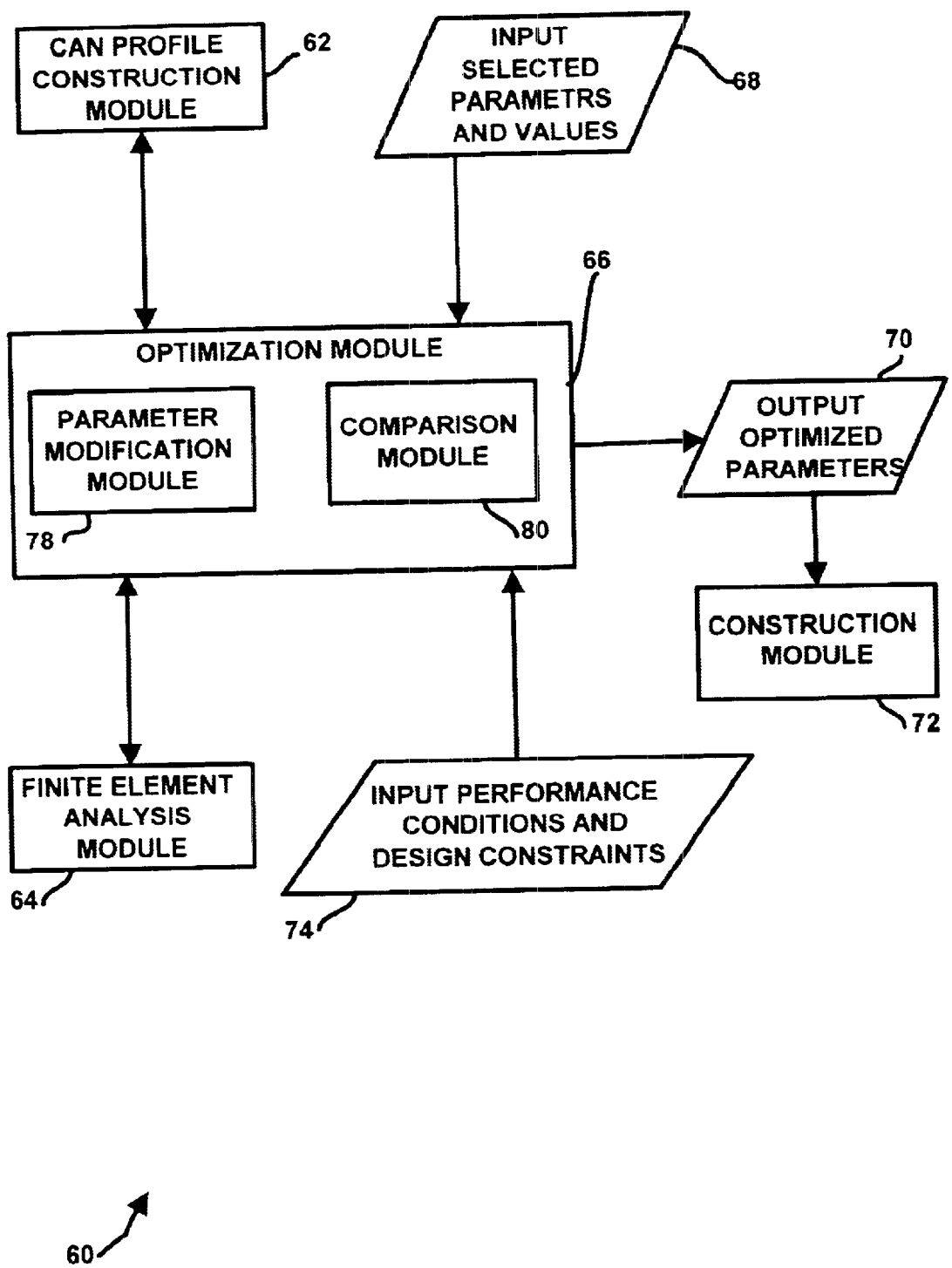
FIG. 1B is a diagram of a system for developing a can bottom profile using finite element analysis techniques according to an embodiment of the present invention.

FIG. 1B shows a computer system 60 for developing a can bottom profile according to an embodiment of the present invention. A can profile construction module 62 is used to construct an initial can profile as a basis of the design optimization process. The can profile construction module 62 can be a CAD program such as IDEAS-S™. The can profile construction module 62 converts the can profile into parametric form, and passes the can profile to an optimization module 66. The optimization module 66 also receives selected parameters and values 68, which together with the can profile and input performance conditions and design constraints 74 form the basis for design optimization. The selected parameters and values 68 and the can profile are passed to a finite element analysis module 64 by the optimization module 66 where performance of the can profile is determined based on finite element analysis techniques.

The results of the finite element analysis are passed to the optimization module 66 where the performance results are compared with the performance conditions and design constraints in the comparison module 80. If these conditions and constraints are not met then the parameter values are modified by the parameter modification module 78 of the optimization module 66. The modified parameters are retested in the finite element analysis module 64. This process of modifying the parameter values and retesting is continued until either the performance conditions and design constraints are met or until a plurality of can profiles converge.

Once the optimization process has finished the optimized parameters 70 are output to the construction module 72 where an improved can design is constructed.

Figure 2A:
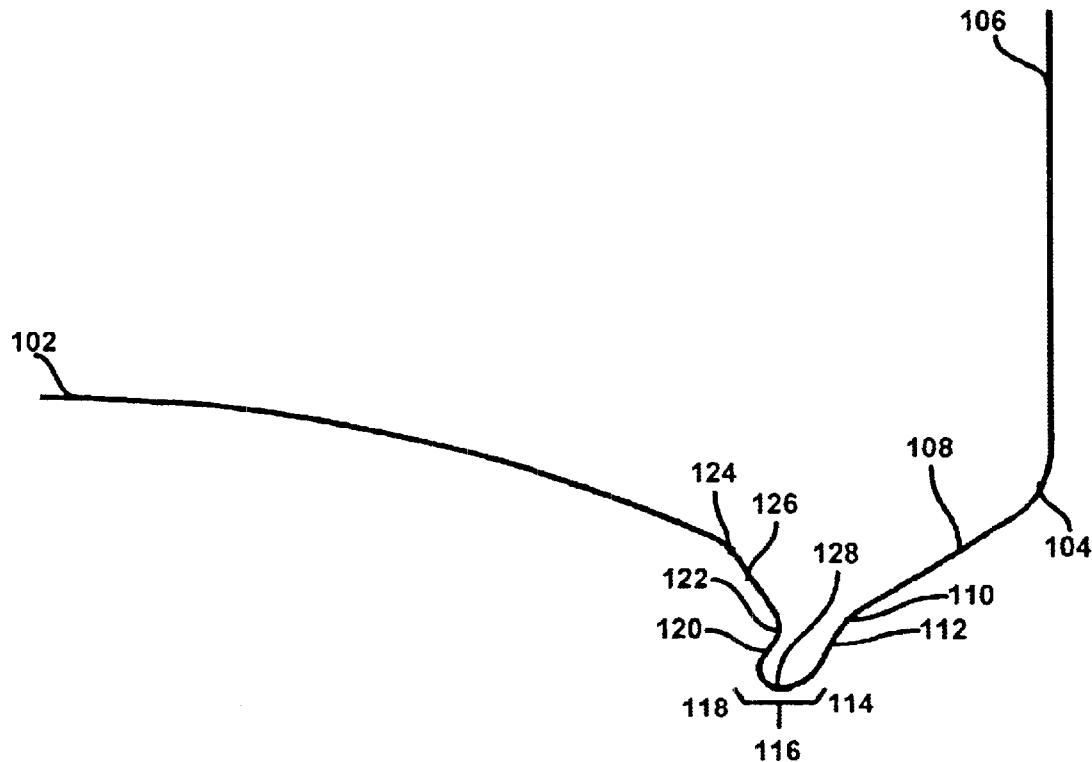
FIG. 2A represents a generic can profile used as a basis for can profile design shown with parameters labeled.
Figure 2A:
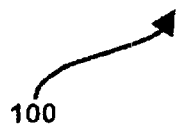
Figure 2B:
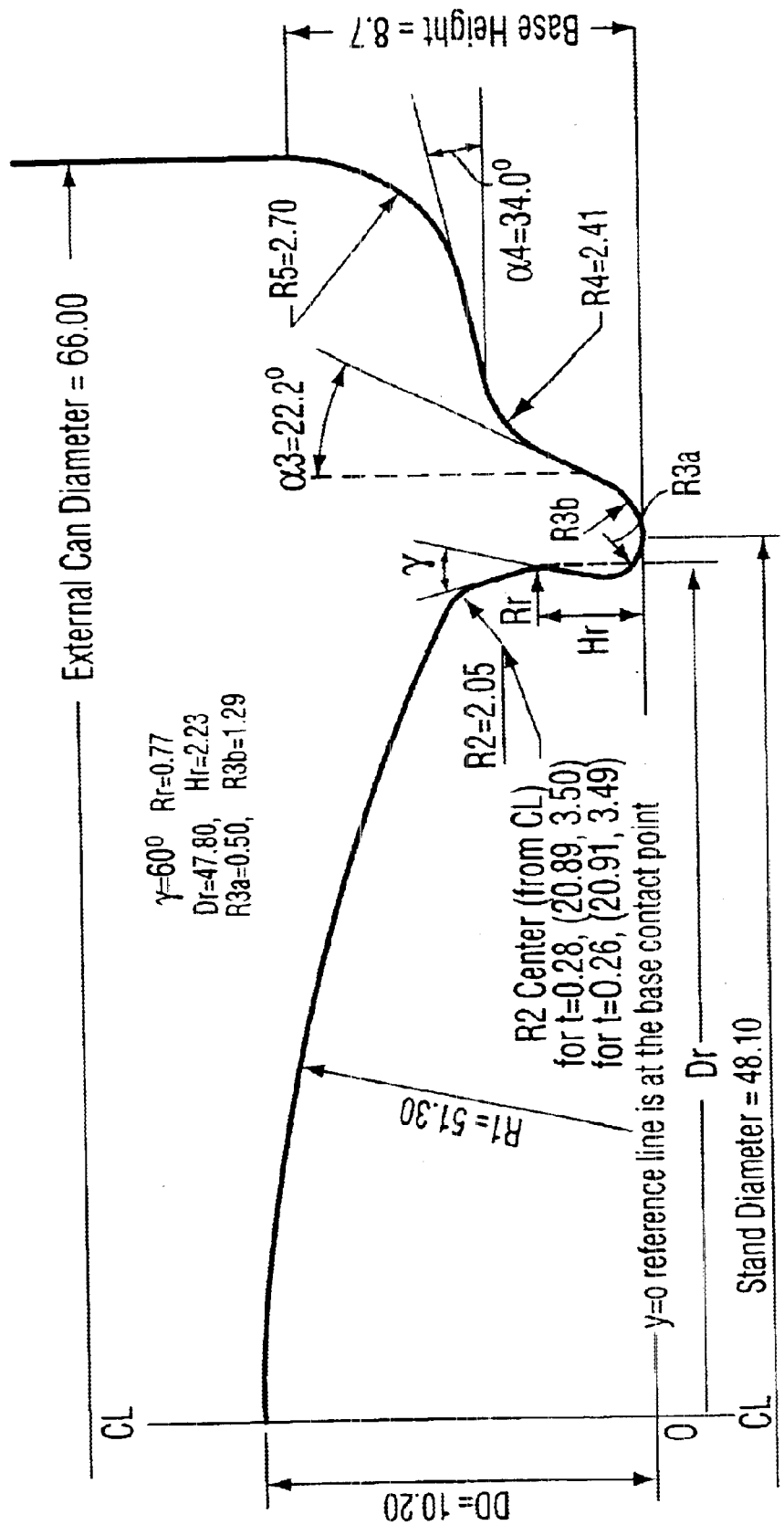
FIG. 2B represents an optimal can bottom profile shown with geometric labels produced by the method shown in FIG. 1.

FIG. 2A shows a generic can profile used as a basis for developing an optimal can profile as the individual parameter values and additional segments may be varied to increase performance. FIG. 2B shows an improved beverage can profile 50 obtained by the method 10 in FIG. 1A using the aforementioned design criteria. Since the profile 50 of this beverage can is symmetric, only half of the profile is shown. FIG. 2A is labeled with parametric descriptors and FIG. 2B is labeled with geometric descriptors. In general, the beverage can profile 100 (FIG. 2A) has a concave dome 102, a bottom rim 128, a cylindrical side wall 106 and an outside connecting wall 108. In addition to the aforementioned performance conditions, several constraints were placed on the physical dimensions of the can design by fixing certain dimensions. These design constraints took into consideration the ability to stack the beverage cans. In the optimized can profile 50, the entire radius of the can from the center to the cylindrical side wall 106 was fixed at 33 mm. The length from the center of the can to the bottom rim 128 was set at 24.05 mm. The height from the bottom stand 116 of the bottom rim 128 to the start of the cylindrical side wall was fixed at 8.7 mm. Given these fixed conditions there are a further 13 variable parameters described in Table A1 and discussed below.

A variety of thicknesses for the material used in constructing the beverage can 50 were used and the performance results were compared to each thickness. The improvement results for 0.300 mm and 0.260 mm gauges were identical. That is, the improved geometry is independent of material gauge.

In the generic can profile 100, the cylindrical side wall 106 connects to the outside connecting wall 108 through a first circular connector 104 on one end. The optimized can profile 50 has the first circular connector 104 having a lower body radius (R5) of approximately 2.7 mm. The outside connecting wall 108 is tilted upwards with a lower body angle ($\alpha 4$) of approximately 34° from the horizontal plane.

The bottom rim 128 of the generic can profile 100 contains an outside rim wall 112, an inside rim wall 120, and a bottom stand 116. The outside rim wall 112 is situated on the outer portion of the bottom rim 128 from the center of the can and is outwardly inclined towards the cylindrical side wall 106. This outside rim wall 112 on the optimized can profile 50 is horizontally inclined at approximately 67.8°. The inside rim wall 3120 is situated on the inner portion of the bottom rim 128 towards the center of the can and is inclined in a direction similar to that of the outside rim wall 112 (e.g. towards the cylindrical side wall 106). This inside rim wall 112 is horizontally inclined at approximately 83.4°. The bottom stand 116 is composed of two circular pieces of different radii (R3$a$ and R3$b$) that connect the outside rim wall 112 and the inside rim wall 120.

The two circular pieces of the bottom stand 116 in the generic can profile 100 are an outside bottom stand portion 4114 and an inside bottom stand portion 118. The inside nose radius (R3$a$) of the circle of the outside bottom stand portion 114 in the optimized can profile 50 is approximately 0.5 mm. The outside nose radius (R3$b$) of the circle of the inside bottom stand portion 118 is approximately 1.29 mm. The outside bottom stand portion 114 is connected to the outside rim wall 112 and the inside bottom stand portion 118 which in turn is connected to the inside bottom wall 120.

In the generic can profile 100, the outside rim wall 112 of the bottom rim 128 connects to the outside connecting wall 108 via a second circular connector 110. The profile radius (R4) of the second circular connector 110 in the optimized can profile 50 is approximately 2.41 mm.

In the generic can profile 100, the bottom rim 128 connects to the concave-dome 102 via an inside slanted connecting wall 126 and a third and fourth circular connectors 122 and 124. The inside slanted connecting wall 126 of the optimized can profile 50 is tilted upwards at approximately 36.6° from the horizontal plane and has a length of approximately 1.89 mm. The third circular connector 122 connects the inside rim wall 120 with the inside slanted connecting wall 126 through a circular portion with a reform radius (Rr) of approximately 0.77 mm. The third circular connector 122 is approximately 23.9 mm from the center of the can and a reform height of approximately 2.23 mm (Hr) from the bottom stand 116 of the bottom rim 128. The fourth circular connector 124 connects the inside slanted connecting wall 126 with the concave dome 102 through a circular portion with an inner transition radius (R2) of approximately 2.05 mm.

The domed portion 102 has a spherical radius (R1) of approximately 51.3 mm. The dome depth (DD) from the top of the concave domed portion 102 at the center of the beverage can to the bottom of the bottom rim 128 is approximately 10.2 mm.

TABLE A1

VARIABLE PARAMETERS OF THE OPTIMAL CAN PROFILE 20

| ELEMENT | DESCRIPTION | OPTIMAL |
| --- | --- | --- |
| DD | Dome depth | 10.2 mm |
| R1 | Spherical radius | 51.3 mm |
| R2 | Inner transition radius | 2.05 mm |
| Rr | Reform radius | 0.77 mm |
| Hr | Reform height | 2.23 mm |
| Dr | Reform depth diameter | 47.8 mm |
| R3a | Inside nose radius | 0.5 mm |
| R3b | Outside nose radius | 1.29 mm |
| R4 | Profile radius | 2.41 mm |
| R5 | Lower body radius | 34 mm |
| $\alpha 4$ | lower body angle | 34° |
| $\alpha 3$ | outside nose angle to vertical | 22.2° |

The performance of the improved beverage can profile 50 described in FIG. 2B exceeds the basic design criteria performance indicators of being able to withstand a Dome Reversal Pressure of at least 100 PSI, a Bottom Squat Load of at least 1000 N and a maximum Bottom Growth of 1.0 mm. Specifically, the improved beverage can profile 50 can withstand a Dome Reversal Pressure of 113 PSI, a Bottom Squat Load of 1400 N and has a Bottom Growth of 0.87 mm. The improved beverage can profile 50 has provided a superior performance to existing designs that should enable enabled the sheet thickness for can body production to be reduced to 0.240 mm, which is significantly lower than for any current production can, while meeting the performance targets.

In summary, the aforementioned method 10 of developing the improved beverage can profile 50 is accomplished by using a CAD program, such as IDEAS-S™ to construct a profile from the generic profile using a desired number of parameters. ANSYS™ FE then optimizes the design according to specific performance indicators, such as dome reversal pressure and maximum load at axial base collapse. ABAQUS™ FE then performs the FE analysis on each iteration of the design profile generated by ANSYS™ FE.

While the method of the present invention was described in an exemplary embodiment, various other embodiments that do not depart from the scope of the invention will be obvious to one skilled in the art.

What is claimed is:

1. A method executed by a computer system as part of a computer-implemented program for developing a can design profile from a can design model geometrically represented in parametric form using a performance condition and a design constraint, the can design model having a performance in response to expected forces applied thereto, said method comprising the steps of:
   (a) selecting optimization conditions including selected geometric parameters from the parametric form of the can design model and values for the selected geometric parameters;
   (b) performing finite element analysis on the parametric form of the can design model based on the selected optimization conditions to determine a performance of the can design model in response to the expected forces given the values for the selected geometric parameters; and
   (c) modifying the values of the selected geometric parameters based on the performance from step (b).

2. The method according to claim 1 wherein the step of (c) modifying the values of the selected geometric parameters includes:
   (ci) comparing the performance from the performed finite element analysis with the performance condition and the values for the selected geometric parameters with the design constraint to determine if the performance condition and the design constraint are satisfied; and
   (cii) modifying the values for the selected geometric parameters if the performance condition and the design constraint are not satisfied and repeating steps (b) and (ci) using the modified values for the selected geometric parameters.

3. The method of claim 1, wherein the parametric form is defined by a family of geometries that are described using parameters representing radii, angles and distances.

4. The method of claim 1, wherein the performance condition is selected from the group consisting of: dome reversal pressure, bottom growth, and bottom squat load.

5. The method of claim 1, wherein the design constraint is selected from the group consisting of: base stand diameter, base height, external can diameter, gauge thickness.

6. A method executed by a computer system as part of a computer-implemented program for developing a can design profile from a can design model geometrically represented in parametric form using a performance condition and a design constraint, the can design model having a performance in response to expected forces applied thereto, said method comprising the steps of:
   (a) selecting a plurality of optimization condition sets, each of the plurality of optimization condition sets including selected geometric parameters from the parametric form of the can design model and values for the selected geometric parameters;
   (b) performing finite element analysis on the parametric form of the can design model using each of the plurality of optimization condition sets to determine a performance of the can design model in response to the expected forces given the values for the selected geometric parameters; and
   (c) modifying the values of the selected geometric parameters in each of the plurality of optimization condition sets based on the performance of step (b).

7. The method according to claim 6 wherein the step of (c) modifying the values of the selected geometric parameters includes:
   (ci) comparing the performance from each performed finite element analysis with the performance condition and the values for the selected geometric parameters with the design constraint to determine if the performance condition and the design constraint are satisfied; and
   (cii) modifying the values of the selected geometric parameters for each of the plurality of optimization condition sets that does not satisfy the performance condition and the design constraint and repeating steps (b) and (ci) using the modified values until the performance and the values for the selected geometric parameters for each of the plurality of optimization condition sets converge.

8. The method of claim 6, wherein the parametric form is defined by a family of geometries that are described using parameters representing radii, angles and distances.

9. The method of claim 6, wherein the performance condition is selected from the group consisting of: dome reversal pressure, bottom growth, and bottom squat load.

10. The method of claim 6, wherein the design constraint is selected from the group consisting of: base stand diameter, base height, external can diameter, gauge thickness.

11. A method of fabricating a can design profile for an article of manufacture from a can design model geometrically represented in parametric form using a performance condition and a design constraint, the can design model having a performance in response to expected forces applied thereto, said method comprising the steps of:
   (a) selecting optimization conditions including selected geometric parameters from the parametric form of the can design model and values for the selected geometric parameters;
   (b) performing finite element analysis on the parametric form of the can design model based on the selected optimization conditions to determine a performance of the can design model in response to the expected forces given the values for the selected geometric parameters;
   (c) modifying the values of the selected geometric parameters based on the performance from step (b); and
   (d) converting the can design model in parametric form into the can design profile.

12. The method according to claim 11 wherein the step of (c) modifying the selected geometric parameters includes:
   (ci) comparing the performance from the performed finite element analysis with the performance condition and the values for the selected geometric parameters with the design constraint to determine if the performance condition and the design constraint are satisfied; and
   (cii) modifying the values of the selected geometric parameters if the performance condition and the design constraint are not satisfied and repeating steps (b) and (ci) using the modified values for the selected geometric parameters.

13. The method of claim 11, wherein the parametric form is defined by a family of geometries that are described using parameters representing radii, angles and distances.

14. The method of claim 11, wherein the performance condition is selected from the group consisting of: dome reversal pressure, bottom growth, and bottom squat load.

15. The method of claim 11, wherein the design constraint is selected from the group consisting of: base stand diameter, base height, external can diameter, gauge thickness.

16. A metal can designed using the can design profile derived by the method of claim 11, said metal can comprising:
- a cylindrical side wall;
- a bottom stand having a curved base on which the can rests, the curved base having two ends, an outside bottom wall connected to one end of the curved base and inclined towards the cylindrical side wall, and an inside outwardly inclined bottom wall connected to the other end of the curved base and inclined towards the cylindrical side wall;
- an outside connecting wall having two ends, one end being operably connected to the cylindrical side wall and the other end being operably connected to the outside bottom wall;
- a concave dome-shaped bottom wall; and
- an inside connecting wall having two ends, one end being operably connected to the concave dome-shaped bottom wall and the other end being operably connected to the inside outwardly inclined bottom wall.

17. The can according to claim 16, wherein the curved base is not symmetric.

18. The can according to claim 16, wherein the angle between the inside connecting wall and the inside bottom wall is approximately 120°.

19. The can according to claim 16, wherein the incline of the inside bottom wall is approximately 83.4° from the horizontal plane.

20. The can according to claim 16, wherein the incline of the outside outwardly incline bottom wall is approximately 67.8° from the horizontal plane.

21. The can according to claim 16, wherein the incline of the outside connecting wall is approximately 34° from the horizontal plane.

22. A computer system for developing a can design profile from a can design model geometrically represented in parametric form using a performance condition and a design constraint, the can design model having a performance in response to expected forces applied thereto, said system comprising:
- (a) selection means for selecting optimization conditions including selected geometric parameters from the parametric form of the can design model and values for the selected geometric parameters;
- (b) finite element analysis means for performing finite element analysis on the parametric form of the can design model based on the selected optimization conditions to determine a performance of the can design model in response to the expected forces given the values for the selected geometric parameters;
- (c) processing means for modifying the values of the selected geometric parameters based on the performance from the performed finite element analysis; and
- (d) conversion means for converting the can design model in parametric form into the can design profile.

23. The computer system according to claim 22 wherein the processing means includes:
- (ci) comparison means for comparing the performance from the performed finite element analysis with the performance condition and the values for the selected geometric parameters with the design constraint to determine if the performance condition and the design constraint are satisfied; and
- (cii) parameter modification means for modifying the values of the selected geometric parameters if the performance condition and the design constraint are not satisfied.

* * * * *